United States Patent
Pavoni et al.

[11] Patent Number: 6,150,827
[45] Date of Patent: Nov. 21, 2000

[54] AUTOMATIC ADJUSTMENT METHOD FOR ELIMINATION OF THE CENTERING ERROR DURING THE ELECTRICAL TEST ON PRINTED CIRCUIT BOARDS

[75] Inventors: Giovanni Pavoni, Pescantina; Graziano Bagioni; Gianpaolo Antonello, both of Verona, all of Italy

[73] Assignee: Circuit Line SPA, Verona, Italy

[21] Appl. No.: 09/028,289

[22] Filed: Feb. 24, 1998

[30] Foreign Application Priority Data

Apr. 22, 1997 [IT] Italy ................... MI97A0949

[51] Int. Cl.[7] .......... G01R 31/00; G01R 31/02; H01H 31/02
[52] U.S. Cl. .......... 324/758; 324/756; 324/761; 324/537; 324/500
[58] Field of Search .......... 324/758, 537, 324/756, 761, 500; 702/108

[56] References Cited

U.S. PATENT DOCUMENTS

| | | | |
|---|---|---|---|
| 5,065,092 | 11/1991 | Sigler | 324/758 |
| 5,381,104 | 1/1995 | Kimura et al. | 324/758 |
| 5,523,698 | 6/1996 | Antonello et al. | 324/759 |
| 5,574,668 | 11/1996 | Beaty | 324/754 |
| 5,614,819 | 3/1997 | Nucci | 324/758 |

FOREIGN PATENT DOCUMENTS

| | | |
|---|---|---|
| 2180642 | 8/1995 | Canada. |
| 43 02 509A1 | 8/1993 | Germany. |
| 44 06 538A1 | 8/1995 | Germany. |
| 44 38 316A1 | 11/1995 | Germany. |

*Primary Examiner*—Safet Metjahic
*Assistant Examiner*—Jermela M. Hollington
*Attorney, Agent, or Firm*—Burns, Doane, Swecker & Mathis, L.L.P.

[57] ABSTRACT

An automatic adjustment method is described for elimination of the centering error during the electrical test on printed circuit boards, in particular SMT (surface mounting technology) printed circuit boards, in which metal surface bump contacts or pads are used for connection of the components to the PCB. The method includes the step of associating each pad of a centering profile by a function $\rho=f(\theta)$. An electrical test is performed which classifies the pads as open and okay. The $\rho_{max}$ and $\rho_{min}$ curves are determined corresponding to a lower envelope of the centering profiles of the pads found to have no errors of open circuit and an upper envelope of the centering profiles of the pads found to have an error of open circuit, respectively. A zone A is determined of possible displacements to the test needles with respect to the nominal points of contact between needles and pads. An optimal correction $\rho_{opt}$ and $\theta_{opt}$ is determined. A control means is operated to carry out this optimal correction.

6 Claims, 4 Drawing Sheets

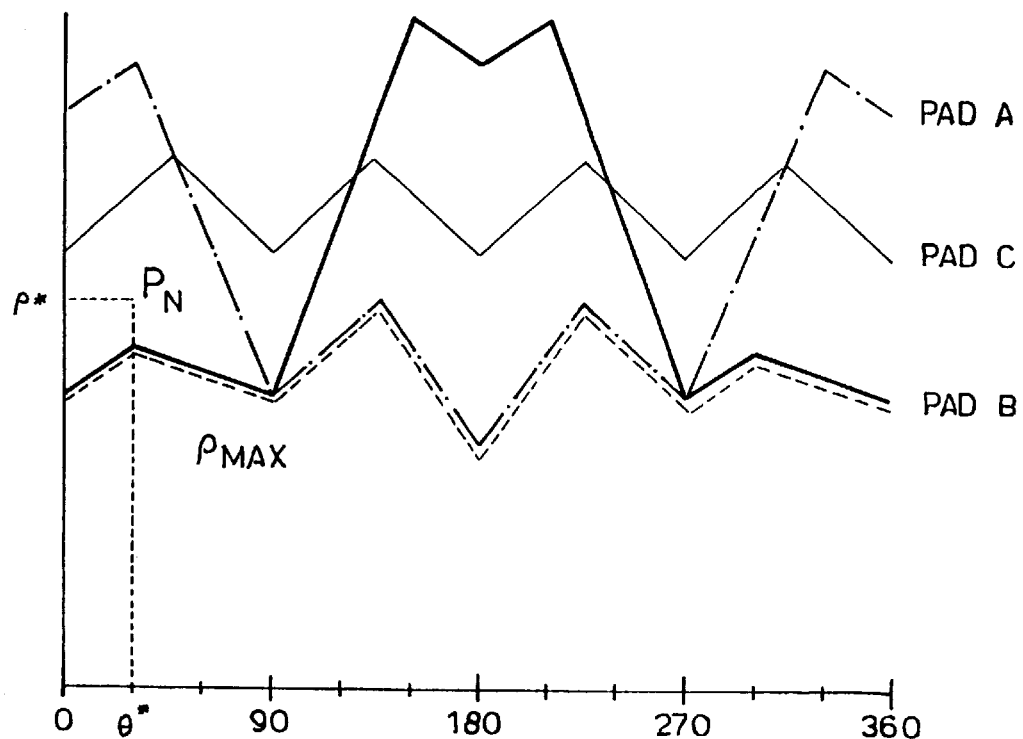
FIG.4
FIG.5
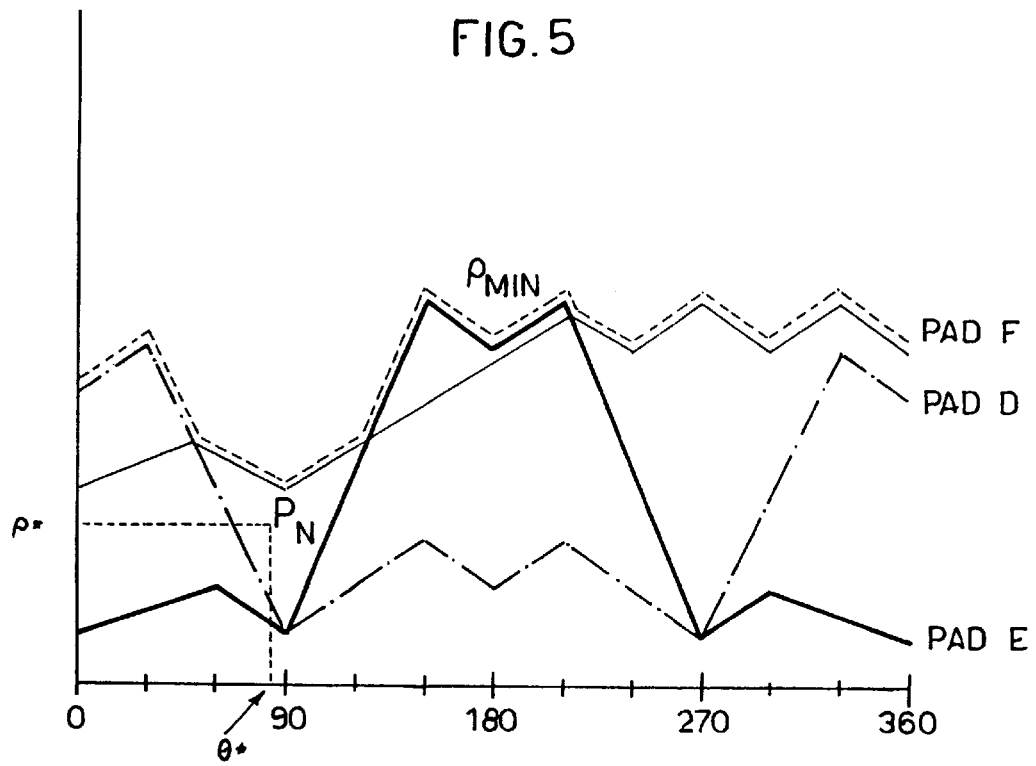

FIG. 6
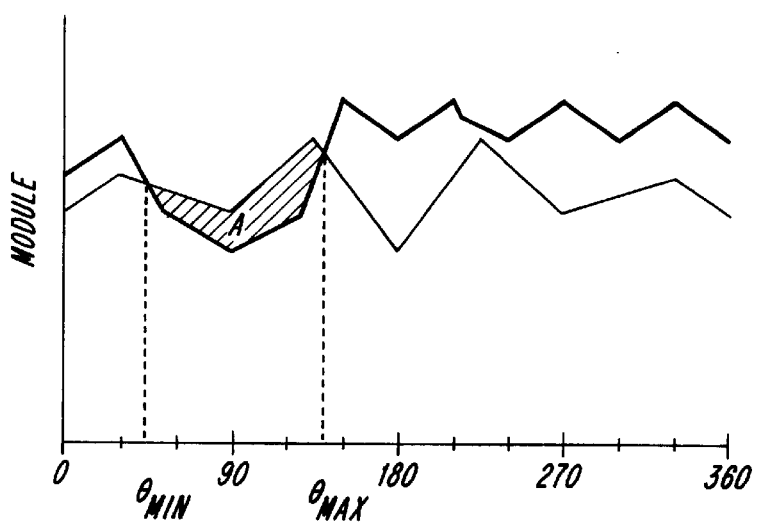
FIG. 7
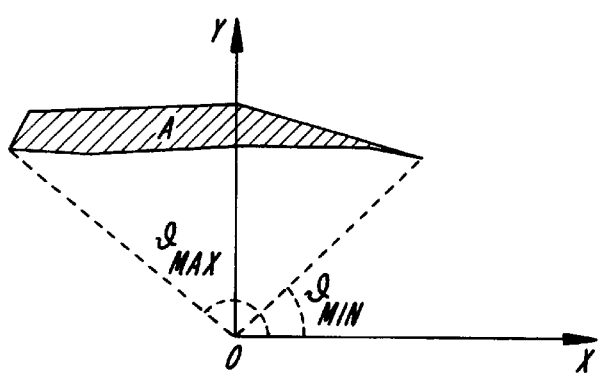
FIG. 8a
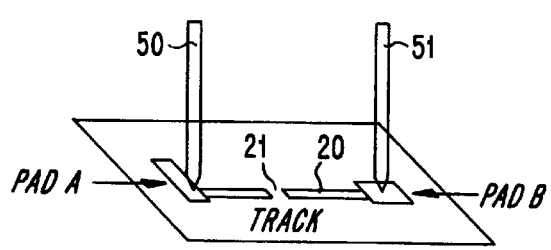
FIG. 8b
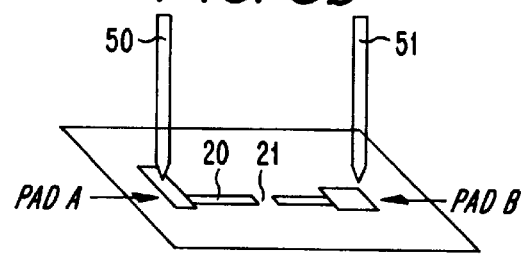
FIRST TPU
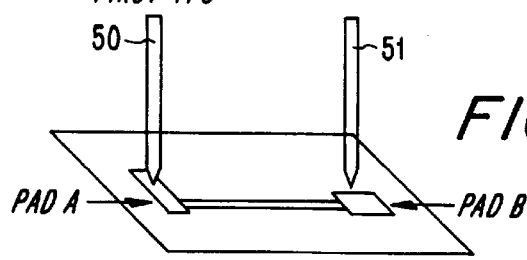
FIG. 8c

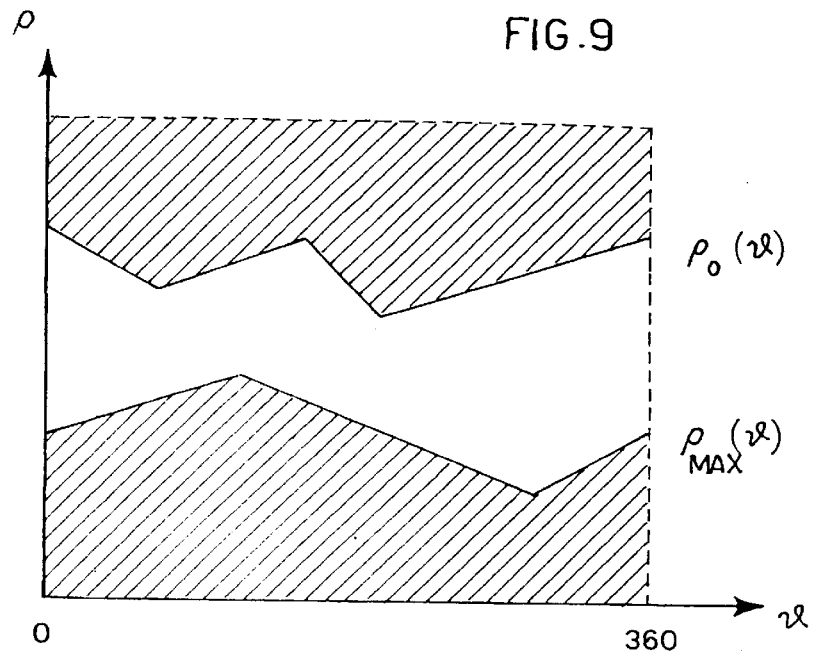
FIG. 9
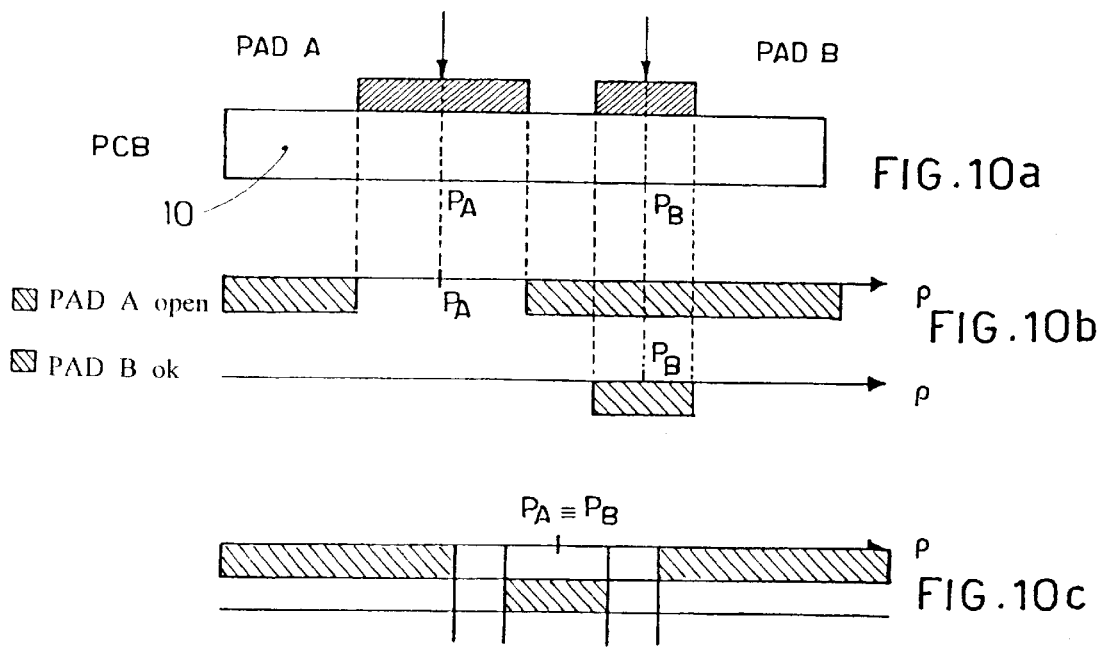
FIG. 10a
FIG. 10b
FIG. 10c

AUTOMATIC ADJUSTMENT METHOD FOR ELIMINATION OF THE CENTERING ERROR DURING THE ELECTRICAL TEST ON PRINTED CIRCUIT BOARDS

This application claims priority under 35 U.S.C. §§119 and/or 365 to Appln. MI 97 A 000949 filed in ITALY on Apr. 22, 1997; the entire content of which is hereby incorporated by reference.

The present invention relates to an automatic adjustment method for elimination of the centering error during the electrical test on printed circuit boards.

The invention refers in particular to performance of the electrical test on printed circuit boards (PCB) which show a misalignment between the pattern of the circuit and the fixing holes used for reference to the test system, a phenomenon also known as hole to pad misregistration.

The machines used to carry out the test perform electrical testing of the printed circuit board by contacting the significant points thereof by means of test needles.

These machines normally operate by means of a universal contact grid, that is, with a constant pitch (generally 100 mils=0.254 cm).

On the other hand, not all the points on the printed circuit board that must be contacted coincide with the grid pitch. It therefore becomes necessary to introduce an adapter element (fixture) that allows the significant points of the printed circuit board to be brought to the grid contacts.

Construction of the fixture is carried out on the basis of the nominal construction data of the printed circuit board to be tested, contained in the PCB plotting and drilling files.

It is therefore concluded that the fixture is a copy of the "nominal" PCB on which the electrical test must be performed.

The actual printed circuit board that comes off the production line, on the other hand, may present some problems of misalignment between the drills and the circuit pattern. This occurs because during manufacture the pattern tracing and drilling of the printed circuit board take place in two different stages and there are changes in the physical parameters of the base between the stages.

The top plate of the fixture, which comes into contact with the PCB to be tested, on the other hand, is constructed by means of a one-step drilling operation, which reproduces both the drills for the pattern contact needles and those for the centering pins. Unless there are actual drilling errors, it therefore represents an exact copy of the nominal PCB to be tested.

The holes present on the PCB may be mechanical holes, generally used for fixing the PCB to the test system, or metallized holes, to make electrical connections between the different layers of the PCB (vias) and for mounting of the rheophore components.

The metallized holes present no testing problems in that they are contacted by means of needles with a conical head that enter the hole. Indeed, they hold the advantage of a sort of automatic centering thanks the action of bringing the PCB to the position required by the fixture.

At present, however, the use of surface mounting technology (SMT), means that metal surface pads are used instead of metallized holes for connection of the components to the PCB. The number of metallized holes present on the printed circuit board has therefore been considerably reduced, because they are used solely as vias.

When the test needle contacts a pad there is no longer an automatic centering action, because it is now a matter of a point touching a surface. The system of pins present on the fixture, which operates on the mechanical holes of the PCB, therefore gains importance for bringing the PCB to be tested into position.

In testing a PCB, problems therefore arise as a result of a possible "hole-to-pad misregistration" phenomenon, due to which there is a misalignment between the mechanical holes and the pattern of said circuit, consisting mainly of pads and connection tracks between them.

If the PCB to be tested is brought by the centering pins of the fixture into a position that does not correspond to the "nominal" position, then some test needles could fail to make contact with the intended pads. These points of the PCB will consequently be indicated by the machine carrying out the electrical test as having open errors.

Should the PCB examined prove unsatisfactory because of this type of error, it must not be discarded however, because its deficiency is not due to real errors, caused by malformations or breaks in the tracks, but to false errors caused by poor centering with respect to the test system.

It is therefore necessary to correct the position of the printed circuit board, to eliminate the error of alignment between the test needles and the test points, before performing the electrical test.

Some systems, for example vision systems, have already been proposed for carrying out this correction, but they are not completely reliable and involve considerable construction complexities with a consequent increase in the cost of the machine.

The object of the invention is to eliminate these drawbacks, providing an automatic adjustment system for identification of a preferential displacement to give to a PCB to be tested, in order to bring the test coverage of these circuit boards to 100%.

This object is achieved, according to the invention, with the characteristics listed in the appended independent claim 1.

Preferred embodiments of the invention emerge from the dependent claims.

Basically, the geometry of the pads of the PCB and the reports of open given by the test are initially studied to gain information for displacement of the PCB to cover all the points.

In a preliminary processing stage, each pad of the PCB is identified according to the position of the nominal point of contact of the test needle on said pad and the shape of its external profile, that is by means of its centering profile.

The centering profile is a function that describes the distance $\rho$ of the edge of the pad from the nominal point of contact of the test needle as the angular direction $\theta$ varies on an arc of 360°.

Once the test has been carried out on the PCB, this will indicate some pads as open and some pads as ok.

By carrying out the intersection of all the centering profiles of the pads that proved to be ok, a lower envelope curve $\rho max$ is identified that delimits all the pairs $(\rho, \theta)$ that indicate the possible displacements of the test needles, relative to a nominal point of contact, for each pad for which contact between the pad and the respective test needle has in any case taken place.

In the hypothesis that all the pads reported as open prove to be so because of lack of centering of a test needle, from the intersection of the centering profiles of the pads indicated as open it is possible to obtain an upper envelope curve $\rho min$ which delimits the pairs $(\rho, \theta)$ which indicate the possible displacements of the test needles, relative to a nominal point of contact, for each pad for which the contact between the pad and the respective test needle has not taken place.

The intersection of the region bounded at the top by ρmax and that bounded at the bottom by ρmin delimits an zone A comprising the pairs (ρ, θ) relating to the estimation of the possible displacements of the test needles with respect to the nominal points of contact, in the completed test stage.

In order to decide on the correction to be made to the adjustment system, it is hypothesized that a small displacement in module of the test needle with respect to the nominal positions is more likely than a greater displacement. The direction θopt in which the displacement of the test needle with respect to the area A is minimal is identified, that is a θopt through which the result will be ρmin(θopt)≦ρmin(θ) with θmin≦θ≦θmax.

The mean value among those possible in the θopt direction can be taken as the preferential value of the ρopt module by means of the formula:

$$\frac{\rho_{\max}(\theta_{opt}) + \rho_{\min}(\theta_{opt})}{2}$$

To carry out the correction the displacement command for the control means θopt and ρopt is then given.

The invention also proposes some filtering criteria aimed at establishing which resulted open pads are really associated with interrupted tracks, before effecting the calculation of θopt e ρopt Further characteristics of the invention will be made clearer by the detailed description that follows, referring to a purely exemplary and therefore non-limiting embodiment thereof, illustrated in the appended drawings, in which:

FIGS. 1(a–d) is a schematic one-dimensional representation of two pads on a PCB: FIG. 1a illustrates the two pads with the respective nominal points of contact with the test needle; FIG. 1b illustrates the zone of the possible displacement of the test needle for pad A (open); FIG. 1c illustrates the zone of the possible displacement of the test needle for pad B (ok); FIG. 1d illustrates the zone for displacement of the test needles resulting from the appropriate superimposition of the indications provided by pads A and B;

FIG. 4 illustrates the lower envelope of the centering profiles of three pads, A, B and C, that gave ok;

FIG. 5 illustrates the upper envelope of the centering profiles of three pads, D, E and F, that gave open;

FIG. 6 illustrates the series of possible displacements of the test needle with respect to the nominal point of contact, for the example shown in FIGS. 4 and 5;

FIG. 7 is a representation in Cartesian coordinates of the series of possible displacements of the test needle with respect to the nominal point of contact, shown in FIG. 6;

FIGS. 8a, 8b and 8c illustrates situations in which some pads are indicated as open though contacted by the respective test needle;

FIG. 9 illustrates the centering profile of a pad with an open error certainly not caused by a misalignment between the pattern and the drills on the PCB;

FIG. 10a is a representation of a PCB with two pads, A and B, respectively open and ok;

FIG. 10b is a representation of the admissible zones for displacement of the test needles in the direction considered;

FIG. 10c is a superimposition of the information processed for the two pads.

With the aid of the appended figures the automatic adjustment method for elimination of the centering error during the electrical test on printed circuit boards according to the invention will now be described.

When, during testing, a misalignment occurs between the mechanical holes, used for centering, and the pattern of the circuit, the PCB is brought by the centering pins of the fixture to a position that does not correspond to the "nominal" position. The result of such a misalignment is a lack of contact between the test needles and one or more pads of the printed circuit board, which is translated into "false" open error signals, that is, not caused by any break or malformation in the tracks pertaining to said pads.

The invention proposes that, from a study of the geometry of the pads of the PCB and the open signals given by the tests, a preferential direction be identified, in which the test circuit must be moved to allow all the points to be covered.

In FIG. 1a, two pads indicated by A and B have been shown on a printed circuit board 10 which is shown only schematically.

It is supposed that the nominal positions of the needles, to allow connection of pads A and B to the measurement circuit, are foreseen respectively in points $P_A$ and $P_B$.

After the electrical test, because of poor centering of the needles, let us suppose that the pad A has been missed by the test needle and proves to be open.

Pad B, on the other hand, despite the fact that the test needle dedicated to it is displaced with respect to the nominal position by the same amount as that of pad A, is still contacted by the needle and therefore proves ok.

If pad A is open, because of poor centering, then the displacement of the test needle with respect to the nominal point of contact is in the hatched zone of FIG. 1b.

Vice versa, for pad B, which proved ok, the displacement of the test needle must be kept within the zone indicated in FIG. 1c.

Let us suppose that in the presence of poor fixture-PCB centering, all the needles prove to be displaced by the same amount with respect to the nominal positions. Superimposing the nominal positions, that is, making points $P_A$ and $P_B$ coincide in the diagrams in FIGS. 1b and 1c, the zone of the possible displacement of the needle must coincide with the intersection of the indications shown hatched in FIGS. 1b and 1c.

The superimposition operation has been shown schematically in FIG. 1d, and the zone of intersection has been indicated by *. From a study of the geometry of the pads of the PCB and the open signals given by the test, a linear zone * has been identified in which the displacement of each test needle with respect to the corresponding nominal point of contact $P_A$, $P_B$ must be localized.

Figure 1:
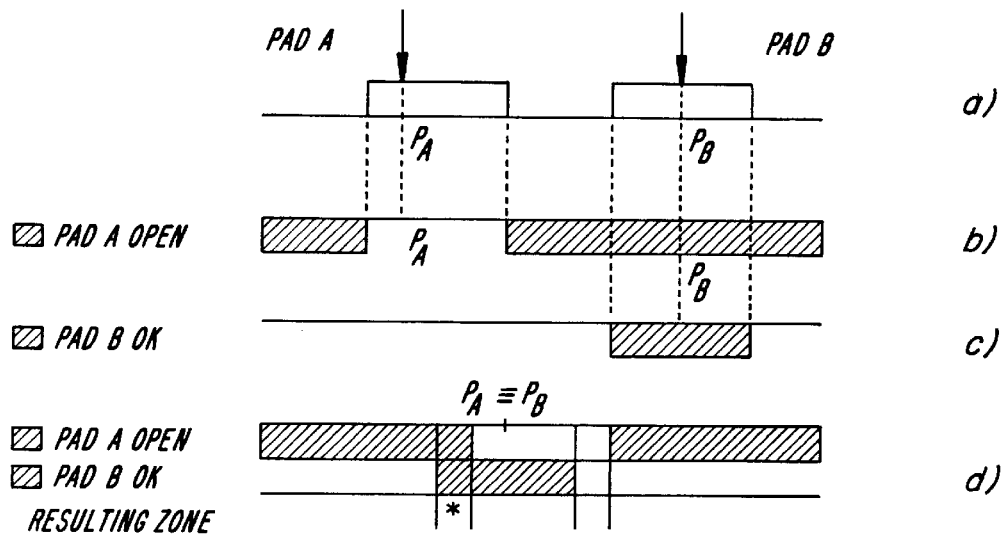

From the one-dimensional analysis of FIG. 1, it is possible to proceed to a two-dimensional analysis, in the way that will now be explained.

Preliminarily, a centering profile is associated with each pad of the PCB being tested.

What is meant by centering profile is a function that describes the distance ρ of the edge of the pad from the nominal point of contact between test needle and pad as the angular direction θ varies:

ρ=f(θ)

The centering profile of a pad is determined solely by the size and shape of the pad as well as the position of contact of the test needle relative to the pad. Thus if the above characteristics of two pads are identical, they will be associated with the same centering profile, although their position on the PCB may be different.

Figure 2:
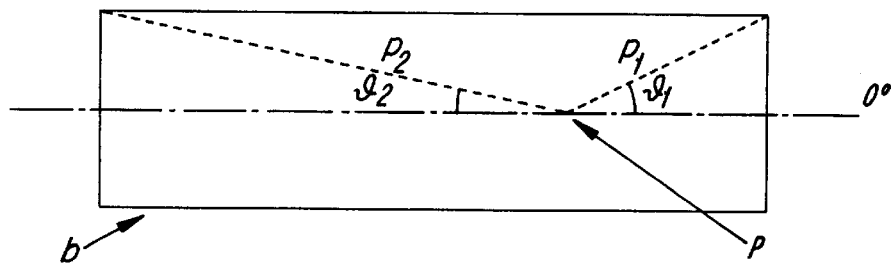
FIG. 2 is an example of the geometry of a pad, in a two-dimensional representation.

In FIG. 2 a pad is schematized two-dimensionally, the nominal point of contact thereof with the test needle has been indicated by P and the edge thereof by b.

Figure 3:
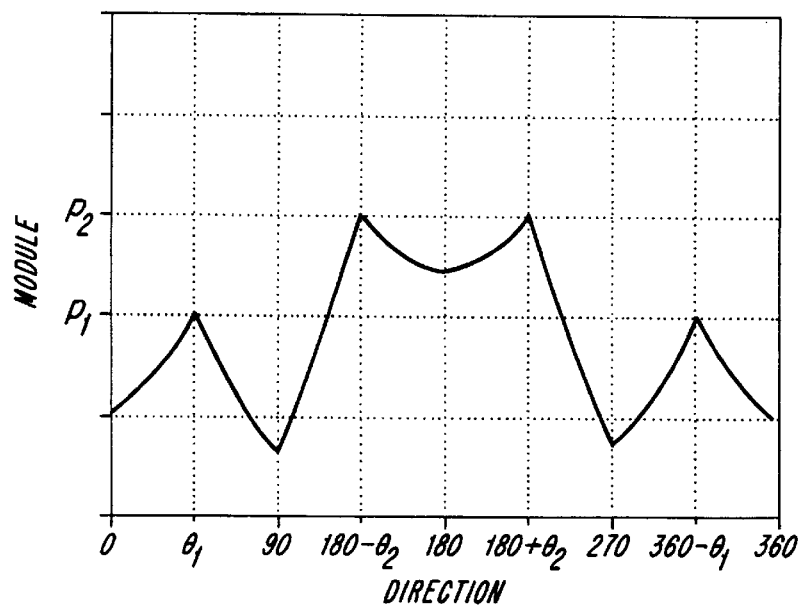
FIG. 3 illustrates the centering profile for the pad having the geometry in FIG. 2.

The centering profile in the diagram in FIG. 3, in which the angular directions θ are shown on the abscissa and the modules ρ on the ordinate, can be qualitatively associated with the pad having the geometry indicated in FIG. 2.

The pairs (ρ, θ) that lie below the curve in FIG. 3 represent possible displacements of the test needle that remain within the pad considered. Vice versa the pairs (ρ, θ) which lie above the curve in FIG. 3 correspond to displacements of the needle in points of the PCB outside the pad considered.

When the electrical test is carried out on a PCB, the result will indicate a series of pads as being open and a series of pads as being ok. For example, considering a generic PCB 10, containing six pads, which are indicated by letters A, B, C, D, E and F; let us suppose that pads A, B and C are ok and pads D, E and F are open.

From the analysis of the centering profiles of the pads that have given ok it is possible to define a region of the plane (ρ, θ) within which any displacement of the test needles in relation to the nominal points of contact with the PCB must be confined. Supposing that the centering profiles for pads A, B and C found to be ok are those indicated in FIG. 4, superimposing the profiles of these pads, the lower envelope curve indicated with ρmax in FIG. 4 will be determined.

The only displacement values admissible for the test needles are those that correspond to the pairs (ρ, θ) beneath the lower envelope curve ρmax.

For example, a value for the displacement of the test needle with respect to the nominal position with a module ρ* and direction θ* (point PN in FIG. 4) is not possible, in that it corresponds to a displacement of the test needle in a point on the PCB outside the pad B, which should therefore have had the open error, contrary to the test result.

Vice versa, from the analysis of the centering profiles of pads D, E and F which have given open, it is possible to gain a piece of information complementary to the preceding one, that is to define a region of the plane (ρ, θ) of admissible values for the displacement in module as the direction varies.

This statement is strictly true only in the hypothesis that the open errors are all "false", that is, not caused by malformations or breaks in the tracks that pertain to some pads.

Supposing that the centering profiles for pads D, E and F are those indicated in FIG. 5, on superimposing the profiles of these pads, which have given open, an upper envelope curve is determined, indicated by ρmin in FIG. 5.

The only displacement values admissible for all the pads E, D and F to be open are those that correspond to the pairs (ρ, θ) above the ρmin curve.

For example, a value for the displacement of the test needle with respect to the nominal position with a module p* and direction θ* (point PN in FIG. 5) is not possible, in that it corresponds to a point on the PCB inside the pad F, which should therefore have proved ok.

Since, in the example shown, each admissible value for the displacement of the test needle must belong simultaneously to the region bounded at the top by ρmax and that bounded at the bottom by ρmin, the intersection of the two regions corresponds to a set of acceptable values for the module and direction of the displacement, as shown in the hatched zone A in FIG. 6.

The new item of information that derives from an analysis of FIG. 6 is a range for the possible directions (θmin<θ<θmax) of displacement of the test needle in relation to the corresponding nominal point of contact on the PCB.

The centering method must provide the adjustment system with indications on the preferential direction, among those admissible, with the relative module displacement value.

The decision on the correction to be made among those admissible must be simple and rapid, in order to minimize the time taken by a calculation algorithm to reach a result.

For a better visualization of the possible displacements the transformation from polar coordinates to Cartesian coordinates is considered:

$$\begin{cases} x = \rho \cdot \cos\theta \\ y = \rho \cdot \sin\theta \end{cases}$$

A calculation of the zone A in which the test needle can be displaced on the basis of FIG. 6 is therefore that in Cartesian coordinates indicated in FIG. 7, where the origin O indicates the nominal point of contact.

A simple and rapid method for deciding the correction to make among those admissible (set A) to improve centering of the PCB being tested, is based on the hypothesis that a small displacement (in module) of the test needle in relation to the nominal position is more likely than a larger displacement.

The direction in which this displacement is minimal in module is therefore considered as the preferential direction θopt, that is:

$$\theta_{opt}: \rho_{min}(\theta_{opt}) \leq \rho_{min}(\theta) \text{ with } \theta_{min} < \theta < \theta_{max}.$$

At the same time, the mean value among those admissible in the direction θopt is taken as the preferential value of the module θopt of the displacement, that is $$\rho_{opt} = \frac{\rho_{max}(\theta_{opt}) + \rho_{min}(\theta_{opt})}{2}$$

This choice is based on the consideration that the difference between the ρmax (θopt) and ρmin (θopt) values is not expected to be sufficiently high for a displacement in module equal to ρmin (θopt) to be considered appreciably more likely than one equal to ρmax (θopt).

The method proposed to indicate to the adjustment system the correction to be made among those possible exploits magnitudes already available and is fairly simple from a computational viewpoint in that it is a matter of finding the minimum of a function f(θ).

Before carrying out the calculation of θopt and ρopt, after having received the information relating to the ok pads and the open pads, it is best to carry out a selection or filtering among the centering profiles of the pads that prove open, in order not to obtain misleading or impossible results.

In fact, the basic hypothesis in the proposed method is that the pads recorded as open are suffering from an error because of failure of the test needle to make contact.

Actually, a pad is declared open if it is associated with a machine point which, after the electrical test of the PCB being examined, is contained in the error buffer.

The error buffer forms the main output of the electrical test on a printed circuit. In particular, the open errors detected during the test are coded therein, by means of the first TPU (test point used) of the subpolygonal associated with the open error, the open resistance measured and the first TPU of the polygonal to which the open error pertains.

Two machine points, which are potentially associated with two pads which must in turn be declared open, therefore correspond to each open error.

On the basis of the information received from the electrical test it is therefore not possible to establish whether an open pad has been contacted by the test needle or not.

In FIGS. 8a, b and c some situations are presented in which both pads A and B are recorded as open, but at least one of them has actually been touched by the needle.

In FIG. 8a, because of an actual break or malformation 21 in a track 20, pads A and B have been recorded as open, though both have been touched by the respective test needles 50, 51.

In FIG. 8b, because of a break 21 in the track 20 together with incorrect centering of the fixture, pads A and B are recorded as open, but only B has not been contacted by the corresponding test needle 51.

In FIG. 8c, in the presence of incorrect centering of the system, pad A, being associated with a first TPU of a polygonal, is recorded as open, though being touched by the corresponding test needle 50.

The pads which, though being recorded as open, are actually contacted by the test needle represent an incorrect item of information for the proposed method.

The invention therefore proposes filtering criteria aimed at establishing which of the pads shown as open are actually associated with broken tracks, in order to eliminate or minimize the number of possible misleading items of information.

First filtering criterion.

Because of the way in which the centering profiles are defined, the pads situated in different points of the PCB, but with the same size and outer profile shape and the same position of the nominal point of contact of the test needle with respect to centre of the pad, are represented by the same centering profile.

Therefore, if two different pads with the same centering profile have produced different results during the test, this means that in both cases the pad has been touched by the test needle, and one is ok while the other is really open.

Therefore the latter centering profile will not be used in the calculation of $\theta_{opt}$ and of $\rho_{opt}$.

Second filtering criterion.

This second criterion is based on the observation that the lower envelope of the centering profiles $\rho max(\theta)$ of all the pads that have given ok is certainly a correct item of information, because in this case contact between the pad and the test needle is certain.

On the basis of this observation it can be concluded that if a pad diagnosed as open has a centering profile $\rho o(\theta)$ such that $\rho o(\theta) \geq \rho max(\theta)$ for $0 \leq \theta < 360°$, then the open error is certainly not due to lack of contact with the test needle, and it is therefore truly open.

The situation can be explained with reference to the diagrams in FIG. 9, in which $\rho max(\theta)$ represents the lower envelope of the centering profiles of the ok pads and $\rho o(\theta)$ the profile of the open pad.

The pairs $(\rho, \theta)$ beneath the $\rho max (\theta)$ curve indicate, by construction, admissible values for a possible displacement of the test needle, whereas the pairs $(\rho, \theta)$ above the profile $\rho o(\theta)$ of the open pad indicate the only acceptable values for the error to be caused by a displacement of the test needle outside the pad being examined.

The intersection between the two regions being null, it is concluded that the open error for the pad to which the profile $\rho o(\theta)$ corresponds is not attributable to misalignment between the fixture and the PCB tested.

To make this situation even clearer, the one-dimensional example shown in FIGS. 10a–c is considered.

Let us suppose that on the PCB 10 in FIG. 10a the pads indicated with A and B are reported as having an open error and ok, respectively.

The aim is to establish whether pad A is open because of a lack of contact with the test needle or for some other reason.

For the sake of simplicity, the nominal point of contact with the test needle is assumed for both pads to be at their centre.

According to the direction considered, the regions admissible for the displacement of the test needles with respect to the nominal points of contact are shown in FIG. 10b.

Since, as a hypothesis, the displacement of the needles must be of the same magnitude for all the pads, if there has been a displacement this must be contained within the intersection of the admissible regions indicated by the two pads.

In FIG. 10c, superimposing the indications processed for the two pads on the basis of the diagnosis of the test carried out on the PCB, it is found, however, that the intersection between the admissible regions for the displacement of the test needles for the two pads is empty. The admissible displacement region defined by pad B is certainly correct, because since this pad is reported as ok, it is necessarily in contact with the test needle. Therefore, for this reason, pad A must also be in contact with the test needle and the open error it is shown as having is not attributable to poor centering of the PCB being tested.

Applying one or both of the two filtering criteria described above to the correction method according to the invention, the method is optimized, whilst minimizing the possibility of errors.

What is claimed is:

1. An automatic adjustment method for eliminating centering error during an electrical test on printed circuit boards (PCBs), particularly with SMT (surface mounting technology), utilizing surface contact bumps or pads for connection of the components, comprising the following steps:

associating each pad of a centering profile described by a function $\rho = f(\theta)$, the function $f(\theta)$ describing $\rho$, where $\rho$ is the distance of the edge of the pad from a nominal point of contact between a test needle and pad, and $\theta$ the angular direction variable from 0 to 360°, performing the electrical test and classifying the pads as either having errors of open circuit and being open or having no errors of open circuit and being okay, calculating the $\rho_{max}$ and $\rho_{min}$ curves, corresponding to a lower envelope of the centering profiles of the pads found to have no errors of open circuit, and upper envelope of the centering profiles of the pads found to have an error of open circuit, respectively, determining an area A given by the intersection of a region bounded at the top by $\rho_{max}$ and that bounded at the bottom by $\rho_{min}$, the area corresponding to the possible displacements of the test needles with respect to the nominal points of contact of the corresponding pads, determining an optimal correction $\rho_{opt}$, $\theta_{opt}$, among those admissible, and directing displacement of a PCB position control means by said $\rho_{opt}$ and $\theta_{opt}$ quantities.

2. A method according to claim 1, characterized in that said preferential direction $\theta opt$ is chosen so that the displacement is minimal in module, that is $\theta_{opt}:\rho_{min}(\theta_{opt}) \leq \rho_{min}(\theta)$ with $\theta_{min} < \theta < \theta_{max}$.

3. A method according to claim 1, characterized in that said optimal value of the displacement module θopt is the mean value among those admissible in the direction θopt, that is $$\rho_{opt} = \frac{\rho_{\max}(\theta_{opt}) + \rho_{\min}(\theta_{opt})}{2}$$

4. A method according to claim 1, characterized in that it provides for filtering of the centering profiles of the pads which have given open after the test, in order to exclude the real open results, due to a break or malformation in a track.

5. A method according to claim 4, in which the centering profiles of the open pads are not used in the determination of θopt and ρopt if for said centering profiles at least one pad proved ok.

6. A method according to claim 5, in which the centering profiles of those pads indicated as open, which are completely outside said ρmax(θ) curve, the lower envelope of all pads that have given ok in the test, are not used in the calculation of ρopt and θopt.

* * * * *